(12) United States Patent
Lexa et al.

(10) Patent No.: US 11,422,172 B2
(45) Date of Patent: Aug. 23, 2022

(54) RF COAXIAL THERMAL POWER SENSOR

(71) Applicant: Tegam, Inc., Geneva, OH (US)

(72) Inventors: Jefferson D. Lexa, Jackson, OH (US);
Andrew S. Brush, Chardon, OH (US);
Bernd Lecjaks, Grand River, OH (US)

( * ) Notice: Subject to any disclaimer, the term of this patent is extended or adjusted under 35 U.S.C. 154(b) by 304 days.

(21) Appl. No.: 16/685,582

(22) Filed: Nov. 15, 2019

(65) Prior Publication Data
US 2020/0341038 A1 Oct. 29, 2020

Related U.S. Application Data

(60) Provisional application No. 62/732,198, filed on Sep. 17, 2018.

(51) Int. Cl.
| | |
|---|---|
| G01R 21/02 | (2006.01) |
| H01R 24/42 | (2011.01) |
| H01P 3/00 | (2006.01) |
| H01P 1/26 | (2006.01) |
| H05K 1/18 | (2006.01) |
| H01C 17/00 | (2006.01) |
| H01C 7/00 | (2006.01) |
| H05K 1/02 | (2006.01) |
| H05K 3/30 | (2006.01) |

(52) U.S. Cl.
CPC ............ *G01R 21/02* (2013.01); *H01C 7/006* (2013.01); *H01C 7/008* (2013.01); *H01C 17/006* (2013.01); *H01P 1/264* (2013.01); *H01P 3/003* (2013.01); *H01R 24/42* (2013.01); *H05K 1/0246* (2013.01); *H05K 1/181* (2013.01); *H05K 3/303* (2013.01); *H05K 2201/10022* (2013.01); *H05K 2201/10151* (2013.01)

(58) Field of Classification Search
CPC ...................................................... G01R 21/02
USPC ............................................................ 324/95
See application file for complete search history.

(56) References Cited

U.S. PATENT DOCUMENTS

| | | | | |
|---|---|---|---|---|
| 5,302,024 | A * | 4/1994 | Blum | G01R 21/04 324/95 |
| 9,069,039 | B1 * | 6/2015 | Bowman | G01R 31/2855 |
| 10,476,124 | B2 * | 11/2019 | Holt | H01P 5/107 |
| 10,921,303 | B1 * | 2/2021 | Dong | G01N 27/4146 |
| 2004/0253921 | A1 * | 12/2004 | Turner | G01R 19/0007 455/2.01 |
| 2008/0143319 | A1 * | 6/2008 | Breakenridge | G01R 21/04 324/95 |
| 2008/0252298 | A1 * | 10/2008 | Noujeim | G01K 17/00 324/451 |

(Continued)

*Primary Examiner* — Stanley Tso
(74) *Attorney, Agent, or Firm* — Brennan, Manna & Diamond, LLC

(57) ABSTRACT

A coaxial power sensor assembly configured to provide a broadband matched termination utilizing coplanar waveguide topology while simultaneously providing a source of heat energy for a surface mount chip thermistor element to measure applied input power. The coaxial thermal power sensor is comprised of a thin film resistive device on a dielectric substrate and a surface mount chip thermistor element placed in close planar proximity to the resistive device in order to maximize the heat flux via a closely coupled thermal path to the thermistor and alter the bias current through the resistance to be measured. The power sensor is intended to function from DC to 70 GHz, but the same should not be construed as a limitation.

19 Claims, 3 Drawing Sheets

(56) References Cited

U.S. PATENT DOCUMENTS

| | | | | |
|---|---|---|---|---|
| 2011/0168893 A1* | 7/2011 | Swank | ............... | G01J 5/046 |
| | | | | 250/338.3 |
| 2011/0169592 A1* | 7/2011 | Lexa | ............... | H01C 7/008 |
| | | | | 333/253 |
| 2013/0127675 A1* | 5/2013 | Mallat | ............... | G01R 21/02 |
| | | | | 29/601 |
| 2021/0135398 A1* | 5/2021 | Breakenridge | ......... | H01P 3/08 |
| 2021/0396797 A1* | 12/2021 | Chugg | ............. | G01R 29/0878 |

* cited by examiner

RF COAXIAL THERMAL POWER SENSOR

CROSS-REFERENCE TO RELATED APPLICATION

The present application claims priority to and the benefit of U.S. Provisional Application No. 62/732,198 filed on Sep. 17, 2018, which is incorporated herein by reference in its entirety.

FIELD OF THE INVENTION

The present invention pertains generally to a coaxial power sensor assembly that provides a broadband matched termination utilizing a coplanar waveguide topology while simultaneously providing a source of heat energy for a surface mount thermistor element to measure applied input power.

BACKGROUND OF THE INVENTION

Waveguide power sensors allow for the measurement of radio frequency (RF) power for varying frequency ranges. Present technology utilizes either bead mount or thin-film type thermistor devices to capture the heat produced internally within the mount itself or in proximity to a thin film type resistor respectively. Bead mount devices suffer from complicated assembly techniques and limited frequency range performance, and thin film thermistor devices are permanent in nature (i.e. non-repairable due to burn out) and expensive to fabricate.

Therefore, there is a long felt need in the art for a RF coaxial thermal power sensor that allows standard surface mount assembly techniques to be utilized to build the power sensor in an economical fashion. There is also a need in the art for a thermal power sensor that separates the terminating resistive element from the thermistor sensing device to allow optimization of the terminating load characteristics for the input transmission line resulting in broadband frequency response while simultaneously allowing the thermistor to be biased in an optimal region independent of any terminating load requirements. The ability to provide a standard coaxial interface that covers such a broadband frequency response also reduces the need to obtain additional expensive waveguide calibration standards that would otherwise be necessary to characterize device performance. Finally, there is a long felt need in the art for a coaxial thermal power sensor that is relatively inexpensive to manufacture, safe, and easy to use.

SUMMARY OF THE INVENTION

The following presents a simplified summary in order to provide a basic understanding of some aspects of the disclosed innovation. This summary is not an extensive overview, and it is not intended to identify key/critical elements or to delineate the scope thereof. Its sole purpose is to present some concepts in a simplified form as a prelude to the more detailed description that is presented later.

The coaxial power sensor of the present invention provides a broadband matched termination utilizing coplanar waveguide topology while simultaneously providing a source of heat energy for a surface mount chip thermistor element to measure applied input power. The coaxial power sensor comprises a thin film resistive element on a dielectric substrate and a surface mount chip thermistor element placed in close planar proximity to the thin film resistive element in order to maximize the heat flux via a closely coupled thermal path to the thermistor and alter the bias current through the resistance to be measured. The coaxial power sensor assembly is intended to function from DC to 70 GHz, but the same should not be construed as a limitation.

In one embodiment, a power sensing assembly is provided. The power sensing assembly comprises a conductor coupled to a power sensing component. The power sensing component comprises a substrate, a coplanar waveguide, a first structure and a second structure. The first structure comprises a first resistive element positioned on the substrate and a conductive trace in electrical communication with the conductor at a seated end of the first structure for providing a matched termination to the coplanar waveguide. The first resistive element is a load resistive element. The coplanar waveguide is effectively terminated with low reflection by the first resistive element. The first structure further comprises a dielectric portion surrounding the conductive trace and terminates in the first resistive element at an extended end of the first structure.

The second structure comprises a second resistive element. The second resistive element is a high temperature coefficient of resistance element positioned on the substrate so that is electrically isolated from the first resistive element by a closely coupled thermal path that separates the first and second resistive elements on the substrate. The second structure further comprises a second conductive trace comprising a launch entrance adjacent to the closely coupled thermal path across from the first resistive element at the extended end of the first structure. The conductive trace of the second structure further comprises an inner trace portion. The conductive trace of the second structure comprises a second dielectric portion surrounding the conductive trace of the second structure with a separation portion of the second dielectric portion separating the launch entrance and the inner trace portion. Alternatively, the first resistive element and the second resistive element may be first manufactured on a separate substrate prior to attachment to the substrate.

The first resistive element may comprise a thin film resistor. The second resistance element may comprise a thermistor positioned on the conductive trace of the second structure to capture heat produced by the first resistive element. The thermistor may comprise a readily available surface mount thermistor chip device uniquely positioned to capture the heat produced by a thin film resistor located at the end of a coplanar waveguide transmission line enabling an economical configuration of a microwave/millimeter wave thermal power sensor with good sensitivity and broadband frequency characteristics.

In another embodiment, a method of mounting a high temperature coefficient of resistance element on a coaxial thermal power sensing assembly is provided. The method comprises the steps of fabricating a first resistive element on a substrate of a power sensing component of the coaxial thermal power sensing assembly. Then, a high temperature coefficient of resistance element is fabricated on the substrate. The high temperature coefficient of resistance element is positioned on the substrate to be electrically isolated from, but thermally coupled to the first resistive element. Both the first resistive element and the high temperature coefficient of resistance element are attachable to the substrate via a solder or a conductive adhesive. Alternatively, the first resistive element and the high temperature coefficient of resistance element may be first manufactured on a separate substrate prior to attachment to the dielectric substrate.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and is intended to include all such aspects and their equivalents. Other advantages and novel features will become apparent from the following detailed description when considered in conjunction with the drawings.

BRIEF DESCRIPTION OF THE FIGURES

While the specification concludes with claims particularly pointing out and distinctly claiming the present invention, it is believed that the present invention will be better understood from the following description in conjunction with the accompanying Figures, in which like reference numerals identify like elements, and wherein:

DETAILED DESCRIPTION

In the following detailed description of the preferred embodiment, reference is made to the accompanying drawings that form a part hereof, and in which is shown by way of illustration, and not by way of limitation, a specific preferred embodiment in which the invention may be practiced. It is to be understood that other embodiments may be utilized and that changes may be made without departing from the spirit and scope of the present invention.

The microwave/millimeter coaxial thermal power sensor of the present invention provides a broadband matched termination utilizing coplanar waveguide topology while simultaneously providing a source of heat energy for a surface mount chip thermistor element to measure applied input power. The power sensor typically employs a surface mount thermistor device located in close physical and thermal proximity to an integrated thin film resistor at the end of a coplanar transmission line resulting in good sensitivity and broadband frequency characteristics. This invention may utilize a standard readily available surface mount thermistor chip device uniquely positioned to capture the heat produced by the thin film deposited resistor located at the end of the coplanar waveguide transmission line enabling an economical configuration of a microwave/millimeter wave thermal power sensor with good sensitivity and broadband frequency characteristics.

Figure 1:
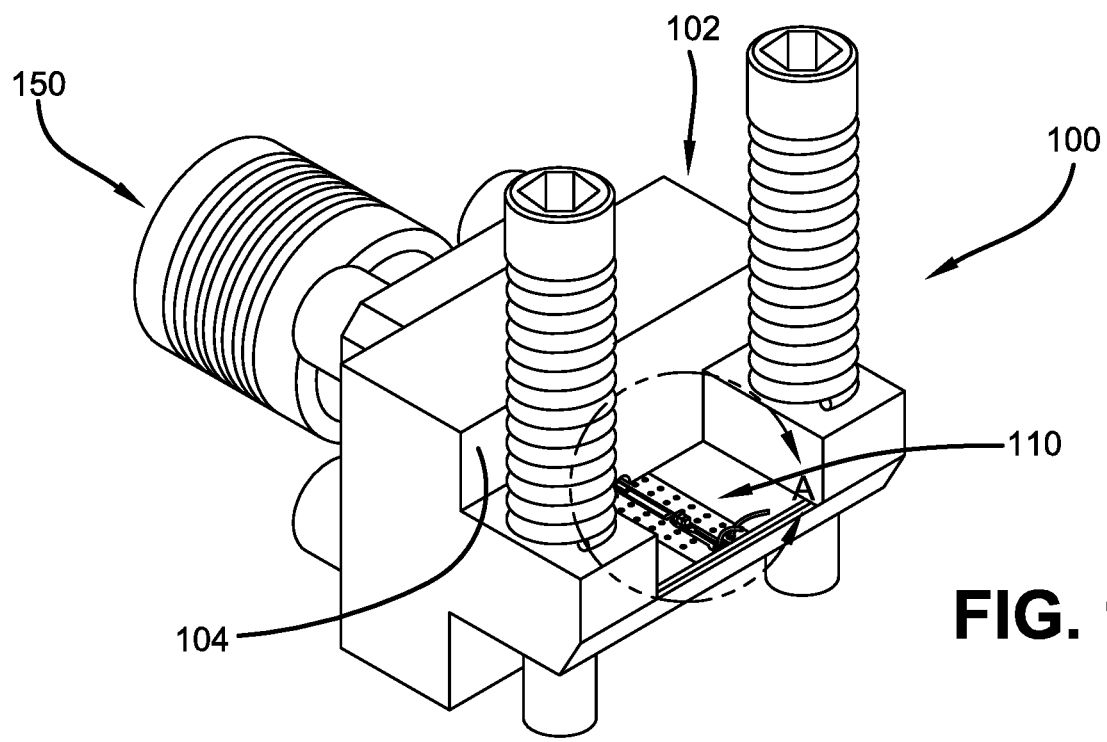
FIG. 1 illustrates a perspective view of a coaxial power sensor assembly in accordance with the disclosed architecture.
Figure 2:
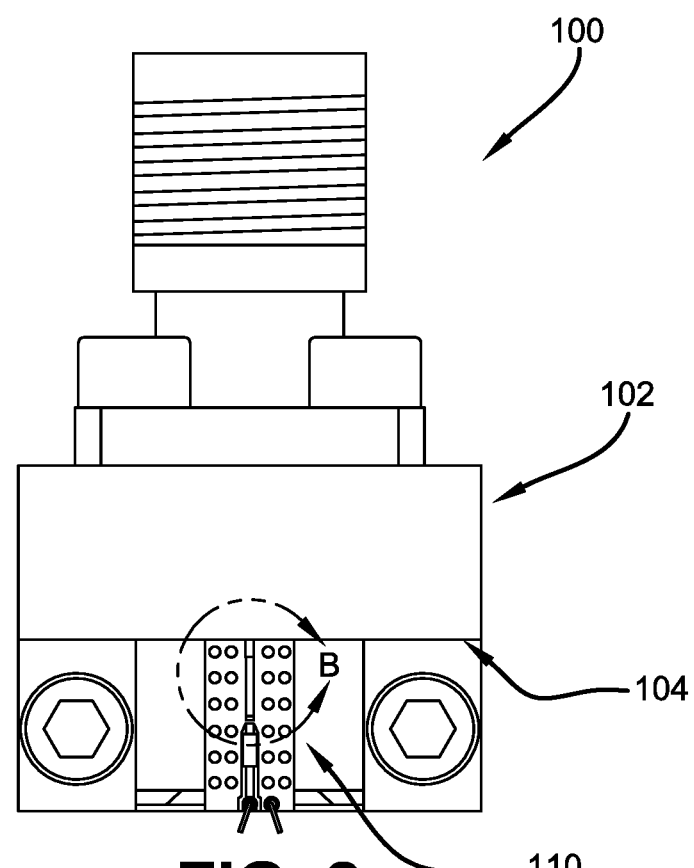
FIG. 2 illustrates an overhead view of the coaxial power sensor assembly in accordance with the disclosed architecture.
Figure 3:
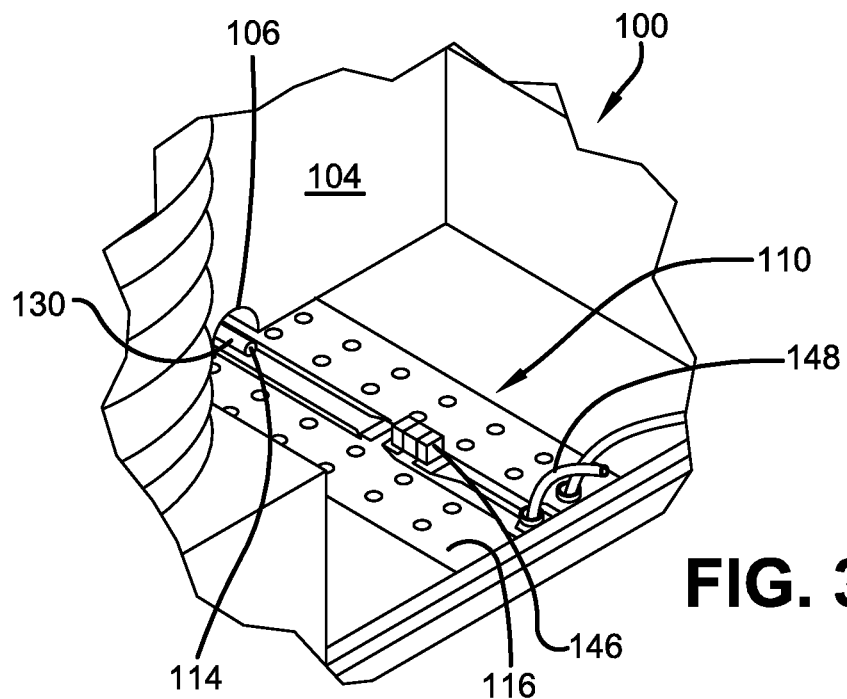
FIG. 3 illustrates cutaway A of FIG. 1 of the coaxial power sensor assembly in accordance with the disclosed architecture.

Turning now to the drawings, FIGS. 1-6 illustrate a power sensing assembly 100. The power sensing assembly 100 is a coaxial thermal power sensing assembly configured to measure applied input power typically functioning in a range from DC to 70 GHZ, but the same should not be construed as a limitation. As illustrated in FIGS. 1-3, the power sensing assembly 100 comprises a housing 102, a conductor 130, and a power sensing component 110. The housing 102 comprises a coaxial port entrance 150 and a back wall 104 comprising an opening 106. A center bore (not shown) connects the coaxial port entrance 150 and the opening 106. The opening 106 functions as a coaxial input entrance to the power sensing component 110.

The conductor 130 is a transmission line that extends through the center bore from the coaxial port entrance 150 through the opening 106 in the back wall 104 where it connects to the power sensing component 110. The conductor 130 terminates in a contact point 114 or pin which connects to the power sensing component 110 as described infra.

Figure 4:
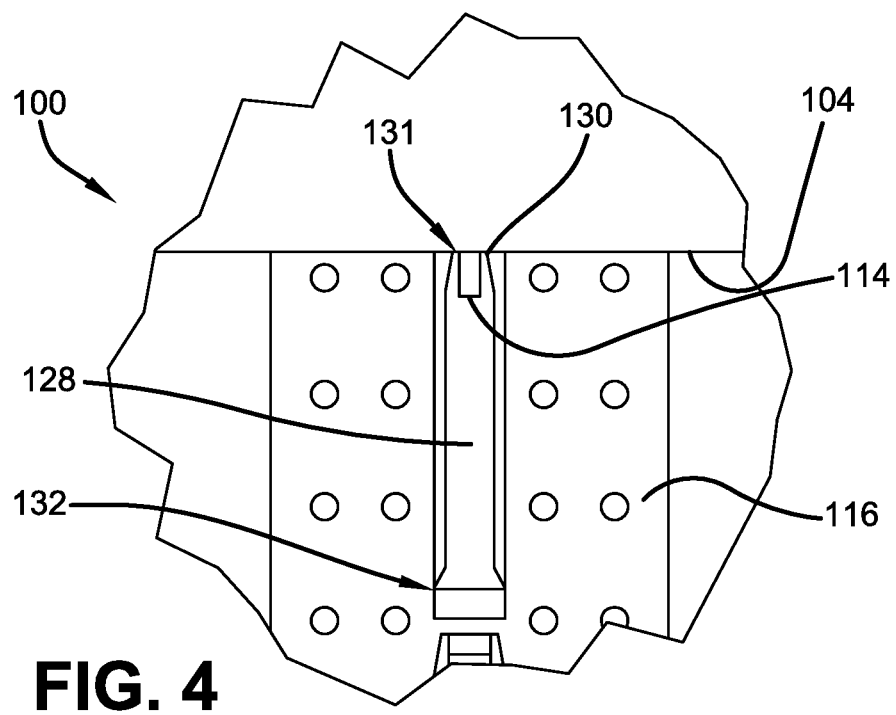
FIG. 4 illustrates cutaway B of FIG. 2 of the coaxial power sensor assembly in accordance with the disclosed architecture.
Figure 5:
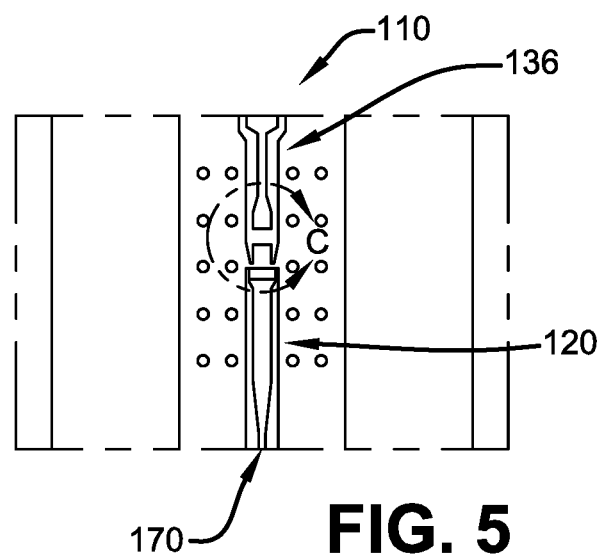
FIG. 5 illustrates an overhead view of a power sensing component of the coaxial power sensor assembly in accordance with the disclosed architecture.
Figure 6:
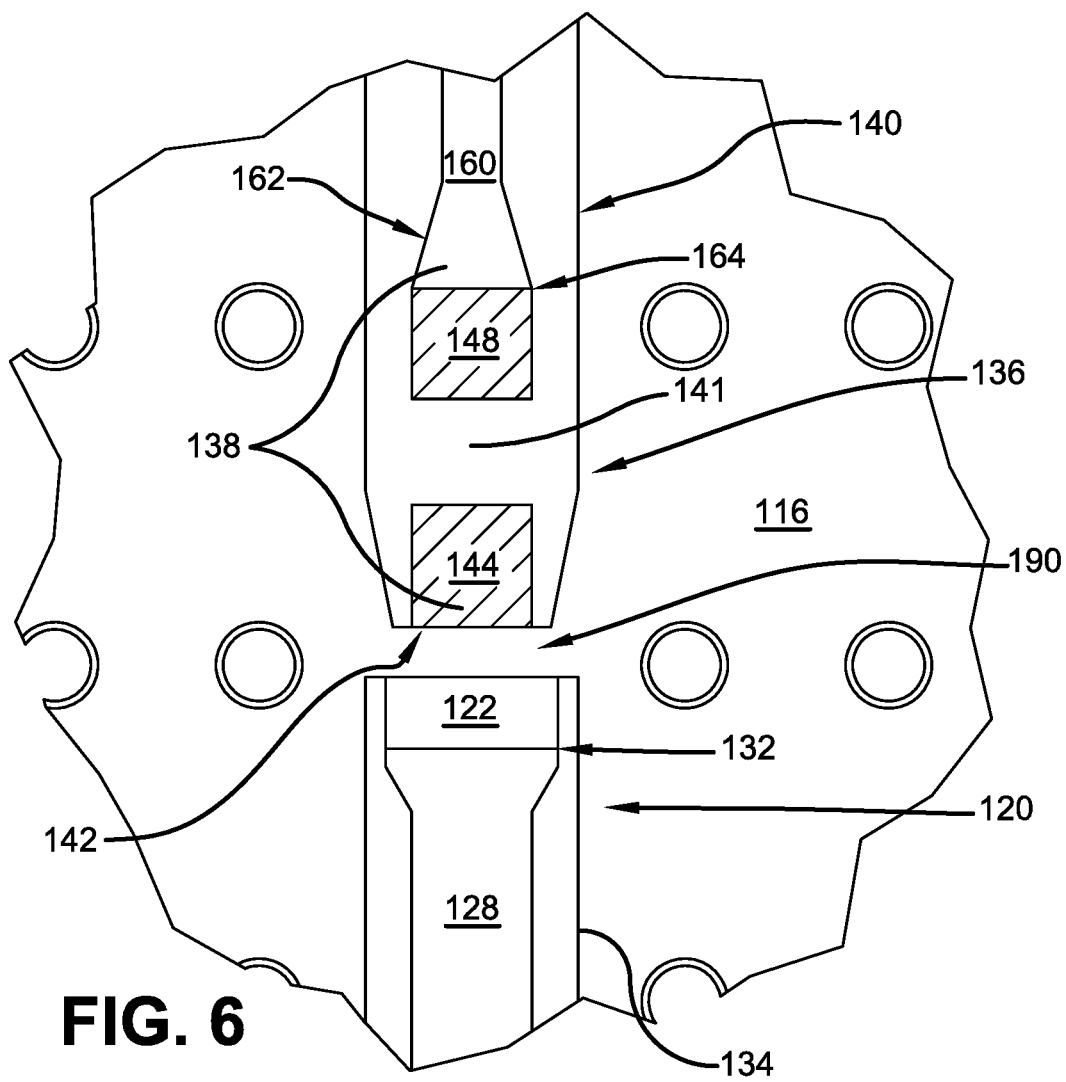
FIG. 6 illustrates cutaway C of FIG. 5 of the power sensing component of the coaxial power sensor assembly in accordance with the disclosed architecture.

As illustrated in FIGS. 4-6, the power sensing component 110 comprises a substrate 116, a coplanar waveguide 170, a first structure 120, and a second structure 136. The substrate 116 extends outward from the back wall 104 of the housing 102. The first structure 120 comprises a first resistive element 122 and a conductive trace 128. The first resistive element 122 is a load resistive element positioned on the substrate 116 along the conductive trace 128 to be in electrical communication with the conductor 130 providing a matched termination to the coplanar waveguide 170. The conductive trace 128 may comprise a layer of gold metal approximately 100 µm thick.

The planar waveguide 170 is a coplanar waveguide, wherein the first and second structures 120 and 136 are attachable to the planar waveguide 170 by using standard deposition techniques. For example, the first and second structures 120 and 136 may be directly manufactured on the substrate 116 of the planar waveguide 170 by a process comprising one of the following: thin film, thick film, sputtering, chemical deposition, plating, wet etching, dry etching, or laser ablation. In another embodiment, the first and second structures 120 and 136 may be directly manufactured on a separate substrate (not shown) by a process comprising one of the following: thin film, thick film, sputtering, chemical deposition, plating, wet etching, dry etching, or laser ablation. Then the separate substrate is attached to the substrate 116 of the coplanar waveguide 170 using a solder or a conductive adhesive.

The conductive trace 128 comprises a seated end 131 and an extended end 132. The seated end 131 extends into the opening 106 in the back wall 104 of the housing 102. The extended end 132 flares outward at its termination opposite the seated end 131. The conductive trace 128 may be configured as a coplanar waveguide or a stripline. The conductive trace 128 is lined up on the substrate 116 with a center of the contact point 114 of the conductor 130 making sure that the seated portion 131 and an edge of the substrate 116 is fully seated approximately 0.020 inches under and against the back wall 104 of the housing 102 allowing for a good ground connection to the metalized ground planes of the substrate 116.

As illustrated in FIGS. 3 and 4 the contact point 114 of the conductor 130 and the design of the power sensor 100 allows for pressure contact of the contact point 114 against the conductive trace 128 to create an electrical connection between the conductor 130 and the power sensing component 110. Alternatively, solder or a conductive adhesive may be used along the length of the contact point 114 as necessary to create a more reliable connection. The conductive trace 128 is resistively terminated by the load resistive element 122 to provide a broadband matched termination with minimal reflection. As such, the coplanar waveguide 170 is effectively terminated by the first resistive element 122.

As illustrated in FIGS. 3-6, the first structure 120 further comprises a dielectric portion 134 outlining the sides of the conductive trace 128 to define the coplanar waveguide 170. The first resistive element 122 may be a thin film resistor or wafer resistor positioned at and extending from the extended end 132 of the conductive trace 128 and deposited on the substrate 116. The extended flared end 132 is geometrically shaped as and acts as a launch into the thin film deposited resistor 122 so as to maintain good broadband matched characteristics up to the V-band.

In one embodiment, the thin film resistor 122 may be a tantalum nitride thin film at approximately+114.29 ohms/square to produce approximately 50 ohms+/−three percent total resistance in the exposed area. The thin film resistor 122 comprises a first underlay adhesion layer and a second underlay adhesion layer. The first underlay adhesion layer may be 100 A TiW (approximately 0.4 μin. THK) and the second underlay adhesion layer may be a 25,000 A gold metal film (approximately 100 μin. THK) for TaN film.

The second structure 136 comprises a second resistive element 146 having a high temperature coefficient of resistance that is electrically isolated from, but thermally coupled to, the first resistive element 122. The second structure 136 further comprises a second conductive trace 138 and a second dielectric portion 140 outlining the second conductive trace 138 to further define the geometrically shaped coplanar waveguide 170. The second conductive trace 138 is a coplanar transmission line and comprises a launch entrance 142 and an inner trace portion 160. The launch entrance 142 is physically separated from the inner trace portion 160 by a separation portion 141 of the second dielectric portion 140 outlining the second conductive trace 138. The inner trace portion 160 comprises a flared portion 164 closest to the separation portion 141 and a tapered portion 162 extending outward from the flared portion 164. The first and second resistive elements 122 and 146 are attachable to the coplanar waveguide 170 by using a solder or conductive adhesive.

The second resistive element 136 is typically a thermistor component 146. The thermistor component 146 is typically a surface mounted thermistor chip. The launch entrance 142 comprises a first surface mounting position 144, and the inner trace portion 160 comprises a second surface mounting position 148. The thermistor component 146 is attached to the first surface mounting position 144 and the second surface mounting position 148 as illustrated in FIG. 3 and is positioned to capture heat produced by the first resistive element 122. The second resistive element 136 is manufactured from a thermistor material, such as, but not limited to, platinum, silicon, germanium, or combinations thereof.

The power sensing component 110 further comprises a closely coupled thermal path 190 or gap that separates the first and second resistive elements 122 and 146. The thermistor component 146 is placed in relatively close proximity to the first resistive element 122 in order to maximize the heat flux via the closely coupled thermal path 190 to the thermistor element 146 and alter the bias current through the resistance to be measured. As such, a change in load power will generate an externally measurable change in the high temperature coefficient of resistance of thermistor element 146. The power sensing component 110 may further comprise a return conductor 148 extending out of the inner trace portion 160 of the second conductive trace 138.

The second resistive element 146 is configured to accept an externally directed current or a low-frequency alternating current to maintain a constant resistance as the externally directed current is varied by the addition of power supplied by the first resistive element 122. Changes in radio frequency power applied to the input end of the coplanar waveguide 170 at the seated end 131 of the conductive trace 128 of the first structure 120 are measurable by measuring changes in the applied externally directed current. Radio frequency waves enter the coplanar waveguide 170 via the seated end 131 of the first structure 120 which acts as a launcher that is configured to transition wave propagation from a coaxial waveguide to the coplanar waveguide 170.

In another embodiment, a method of mounting a high temperature coefficient of resistance element 146 on a coaxial thermal power sensor 100 comprises fabricating a first resistive element 122 on a substrate 116. Then the high temperature coefficient of resistance element 146 is fabricated on the substrate 116 such that the high temperature coefficient of resistance element 146 is arranged to be electrically isolated from, but thermally coupled to, the first resistive element 122. The first resistive element 122 and the high temperature coefficient of resistance element 146 may be attached to the substrate 116 by a solder or a conductive adhesive. Alternatively, the first resistive element 122 and the high temperature coefficient of resistance element 146 may be first manufactured on a separate substrate (not shown) and then the separate substrate is attached to the substrate 116. The high temperature coefficient of resistance element 146 may be manufactured from a thermistor material.

The second resistance element 146 is a surface mount chip thermistor bonded to a plurality of surface mount positions 144 and 148 of a second structure 136 with an electrically conductive epoxy or the like. Thermally conductive epoxy is applied between the plurality of surface mount positions 144 and 148 and the thermistor element 146 providing increased thermal coupling to the thermistor thus maximizing efficiency. Alternatively, the surface mount chip thermistor element 146 may be bonded to the plurality of surface mount positions 144 and 148 using solder (SAC) attachment. A conductive trace 160 of a second structure 136 is specifically designed with a high characteristic impedance connecting to the thermistor element 146 inherently providing RF isolation to the external sensing bias circuitry.

One disadvantage of this type of invention is a lower calibration factor efficiency due to the surface mount thermistor body not being intimately embedded within the same surface as the heat producing resistor in a typical power sensor configuration. As a result, heat produced in the resistor is not transferred to the thermistor body as efficiently as devices with internally produced heat (such as in a bead mount device) or to integrated devices formed within or onto the same surface as the resistor (such as in a thin film thermistor device).

However, this invention allows standard surface mount assembly techniques to be utilized to build the power sensor in an economical fashion. Separating the terminating resistive element from the thermistor sensing device also allows optimization of the terminating load characteristics for the input transmission line resulting in broadband frequency response. At this same time, the thermistor may be biased in an optimal region of operation independent of any terminating load requirements. Use of a standard coaxial interface also reduces the need for maintaining expensive waveguide calibration standards. Additionally, this power sensor configuration is scalable and applicable to all appropriately sized geometric sizes of coplanar waveguide assemblies for the frequency and power of interest and provides an economical method of sensing the delivered power with appropriately sized readily available surface mount chip thermistors.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A power sensor assembly comprising:
   a conductor;
   a power sensing component comprising:
      a dielectric substrate;
      a waveguide comprising an extended flared end;
      a load resistive element comprising a thin film resistor positioned on the dielectric substrate in electrical communication with the conductor for providing a matched termination to the waveguide; and
      a high temperature coefficient of resistance element electrically isolated from the load resistive element; and
   wherein the extended flared end of the waveguide is geometrically shaped to act as a launch into the thin film resistor.

2. The power sensor assembly of claim 1, wherein the load resistive element is separated from the high temperature coefficient of resistance element by a closely coupled thermal path.

3. The power sensor assembly of claim 1, wherein the waveguide is a coplanar waveguide or a stripline.

4. The power sensor assembly of claim 3, wherein the conductive trace is resistively terminated by the load resistive element to provide a broadband matched termination with minimal reflection.

5. The power sensor assembly of claim 1, wherein the high temperature coefficient of resistance element comprises a thermistor chip positioned to capture heat produced by the load resistive element.

6. The power sensor assembly of claim 1, wherein a change in load power will generate an externally measurable change in the high temperature coefficient of resistance element bias power.

7. A coaxial thermal power sensor assembly comprising:
   a planar waveguide comprising an extended flared end effectively terminated with low reflection by a first resistive element comprising a thin film resistor, a dielectric substrate and a conductor;
   a second resistive element comprising a high temperature coefficient of resistance;
   wherein the thin film resistor positioned on the dielectric substrate in electrical communication with the conductor for providing a matched termination to the waveguide;
   wherein the second resistive element is electrically isolated from, but thermally coupled to, the first resistive element; and
   wherein the extended flared end of the waveguide is geometrically shaped to act as a launch into the thin film resistor.

8. The coaxial thermal power sensor assembly of claim 7, wherein the second resistive element is configured to accept an externally directed direct current or a low-frequency alternating current to maintain a constant resistance as the externally directed current is varied by the addition of power supplied by the first resistive element.

9. The coaxial thermal power sensor assembly of claim 8, wherein changes in radio frequency power applied to an input end of the coplanar waveguide are measurable by measuring changes in the applied externally directed current.

10. The coaxial thermal power sensor assembly of claim 7, wherein the planar waveguide is a coplanar waveguide, and the first and second resistive elements are attachable to the coplanar waveguide using a solder or a conductive adhesive.

11. The coaxial thermal power sensor assembly of claim 7, wherein the first and second resistive elements are directly manufactured on a substrate of the coplanar waveguide by a process comprising at least one of the following: thin film, thick film, sputtering, chemical deposition, plating, wet etching, dry etching, or laser ablation.

12. The coaxial thermal power sensor assembly of claim 7, wherein the first and second resistive elements are manufactured together on a separate substrate by a process comprising at least one of the following: thin film, thick film, sputtering, chemical deposition, plating, wet etching, dry etching, or laser ablation; and wherein the separate substrate is then attachable to the coplanar waveguide using a solder or a conductive adhesive.

13. The coaxial thermal power sensor assembly of claim 7, wherein the second resistive element is manufactured from a thermistor material.

14. The coaxial thermal power sensor assembly of claim 7, wherein the second resistive element is manufactured from at least one of the following materials: platinum, silicon, or germanium.

15. The coaxial thermal power sensor assembly of claim 7, wherein radio frequency waves enter the coplanar waveguide via a launcher configured to transition wave propagation from a coaxial to a planar waveguide.

16. A method of mounting a high temperature coefficient of resistance element on a coaxial thermal power sensor assembly comprising the steps of:
   fabricating a waveguide comprising a dielectric substrate, a conductor, and an extended flared end on the dielectric substrate;
   fabricating a first thin film resistive element on the dielectric substrate;
   positioning the first thin film resistive element on the dielectric substrate in electrical communication with the conductor for providing a matched termination to the waveguide so that the extended flared end of the waveguide is geometrically shaped to act as a launch into the first thin film resistive element; and
   fabricating a high temperature coefficient of resistance element on the substrate arranged to be electrically isolated from, but thermally coupled to, the first thin film resistive element.

17. The method of claim 16, wherein the first resistive element and the high temperature coefficient of resistance element are attached to the substrate using a solder or a conductive adhesive.

18. The method of claim 16, wherein the high temperature coefficient of resistance element is manufactured from a thermistor material.

19. The method of claim 16, wherein the first resistive element and the high temperature coefficient of resistance element are first manufactured on a separate substrate, and the separate substrate is then attached to the substrate.

\* \* \* \* \*